United States Patent
Clementi et al.

(10) Patent No.: US 7,125,807 B2
(45) Date of Patent: Oct. 24, 2006

(54) METHOD FOR MANUFACTURING NON-VOLATILE MEMORY CELLS ON A SEMICONDUCTOR SUBSTRATE

(75) Inventors: Cesare Clementi, Busto Arisizio (IT); Alessia Pavan, Merate (IT); Livio Baldi, Agrate Brianza (IT)

(73) Assignee: STMicroelectronics S.r.l., Agrate Briaza (IT)

( * ) Notice: Subject to any disclaimer, the term of this patent is extended or adjusted under 35 U.S.C. 154(b) by 131 days.

(21) Appl. No.: 10/746,878

(22) Filed: Dec. 23, 2003

(65) Prior Publication Data
US 2004/0203250 A1   Oct. 14, 2004

(30) Foreign Application Priority Data
Dec. 30, 2002   (IT)   ............ MI2002A2785

(51) Int. Cl.
*H01L 21/302* (2006.01)
*H01B 13/00* (2006.01)

(52) U.S. Cl. .............. 438/719; 438/257; 438/692; 438/723; 438/724; 216/13

(58) Field of Classification Search .......... None
See application file for complete search history.

(56) References Cited

U.S. PATENT DOCUMENTS

| | | | | |
|---|---|---|---|---|
| 5,310,693 A | * | 5/1994 | Hsue | 438/262 |
| 5,510,286 A | * | 4/1996 | Kim | 438/637 |
| 5,688,705 A | * | 11/1997 | Bergemont | 438/588 |
| 5,998,287 A | * | 12/1999 | Huang | 438/587 |
| 6,027,972 A | * | 2/2000 | Kerber | 438/257 |
| 6,624,027 B1 | * | 9/2003 | Daemen et al. | 438/264 |
| 6,930,348 B1 | * | 8/2005 | Wang | 257/315 |
| 2004/0209472 A1 | * | 10/2004 | Clementi et al. | 438/689 |

FOREIGN PATENT DOCUMENTS

| | | |
|---|---|---|
| EP | 1 361 603 | 11/2003 |
| EP | 1 387 395 | 2/2004 |

OTHER PUBLICATIONS

Streetman, Solid State Electronic Devices, 1990, Prentice Hall, 3rd ed., p. 332.*
Wolf et al., Silicon Processing for the VLSI Era, 1986, Lattice Press, vol. 1, pp. 182-183, 175, 191, 407-408.*
Wolf et al., Silicon Processing for the VLSI Era, 1986, Lattice Press, vol. 1, pp. 407-408.*
Wolf, Silicon Processing for the VLSI Era, 1992, Lattice Press, vol. 2, pp. 354-355, 519-520.*

* cited by examiner

*Primary Examiner*—Nadine Norton
*Assistant Examiner*—Eric B. Chen
(74) *Attorney, Agent, or Firm*—Jenkens & Gilchrist, P.C.

(57) ABSTRACT

A semiconductor substrate has active areas bounded by portions of an insulating layer. A thin layer of tunnel oxide is formed on the substrate and a first layer of conductive material is then deposited. Non-volatile memory cells are manufactured thereon by defining floating gate regions. The definition of these floating gate regions involves defining the first layer of conductive material in order to form a plurality of alternated stripes above pairs of active areas alternated by active areas lacking stripes. Spacers are then formed in the shelter of the side walls of the alternated stripes. A second layer of conductive material is then deposited together with the first layer of conductive material. The spacers are then selectively removed.

13 Claims, 3 Drawing Sheets

METHOD FOR MANUFACTURING NON-VOLATILE MEMORY CELLS ON A SEMICONDUCTOR SUBSTRATE

PRIORITY CLAIM

The present application claims priority from Italian Application for Patent No. MI2002A002785 filed Dec. 30, 2002, the disclosure of which is hereby incorporated by reference.

BACKGROUND OF THE INVENTION

1. Technical Field of the Invention

The present invention relates to a non-volatile memory cell comprising dielectric layers at low dielectric constant.

Although not limited thereto, the invention relates, in particular, but not exclusively, to a non-volatile memory cell of the Flash type, comprising dielectric layers at low dielectric constant and the following description is made with reference to this field of application for convenience of explanation only.

2. Description of Related Art

As it is well known, the Flash EEPROM memory electronic devices integrated on semiconductor comprise a plurality of matrix organised non-volatile memory cells 1; i.e., the cells are organized in rows, called word lines WL, and columns, called bit lines BL as shown in FIG. 1a.

Each non-volatile cell 1 comprises a floating gate MOS transistor as shown in FIG. 1b. The floating gate region FG of the floating gate transistor is realized above the channel region CH realized in the semiconductor substrate 2 and it is separated from the latter by means of a thin tunnel oxide layer 3, whose thickness is between 6 and 12 nm. A control gate region CG is capacitively coupled to the floating gate region FG by means of a single dielectric layer 7 (e.g., an oxide) or by means of the superposition of several dielectric layers for example of the ONO (oxide/nitride/oxide) type.

FIGS. 1b and 1c also show an enlarged view of the sections on a vertical plane of a cell along the channel length L and width W.

The other regions of the transistor are the usual drain D, source S, and body terminals. Metallic electrodes are provided for contacting drain and source terminal with control gate region CG terminals in order to be able to apply pre-established voltage values to the memory cell 1.

The charge stored in the floating gate region FG determines the logic state of the cell 1 by modifying its voltage threshold: fundamental characteristic of the memory cell 1 is in fact that of having two states, one with low threshold voltage ("erased" cell) and one with high threshold voltage ("written" cell). The voltage is applied from outside the control gate region CG, but the electrode effectively controlling the channel state is the floating gate region FG.

The floating gate region FG voltage does not depend only on the control gate region CG voltage, but also on the source, drain and bulk potentials, according to this relation:

$$V_{FG} = \frac{Q_{FG}}{C_{TOT}} + \sum_{i=S,B,D,G} \alpha_i \cdot V_i$$

Where:

$$\alpha_i = C_i/C_{TOT} < 1$$

$$C_{TOT} = \sum_{i=S,B,D,G} C_i$$

In the calculation of the capacitive relations the capacitors get close to capacitors having plane and parallel plates, so:

$$\alpha_G = \frac{C_G}{C_{TOT}} = \frac{1}{\left(1 + \frac{W}{W+A} \cdot \frac{t_{ONO}}{t_{ox}}\right)}$$

$$\alpha_{S,B,D} = \frac{C_{S,B,D}}{C_{TOT}} = \frac{\frac{L_{S,B,D}}{L}}{\left(1 + \frac{W+A}{W} \cdot \frac{t_{ox}}{t_{ONO}}\right)}$$

where: $Q_{fg}$=total charge stored in the FG; $C_{tot}$=total capacitance related to the FG, equal to the sum of the partial capacitances related to the i-th element; $\alpha_i$=capacitive coupling coefficient of the FG with the i-th element; $V_i$=voltage of the i-th element; A=total length of the superposition of FG and insulating oxide (FOX); $t_{ONO}$=thickness of the interpoly dielectric (7) $t_{ox}$=thickness of the tunnel oxide (3) $L_i$=efficient electric length of the superposition region of FG and i-th element, where i can assume the S=source, B=body, D=drain, G=gate and W=channel width values From these relations the importance of the form and of the profile of the floating gate region FG is understood. In particular, it becomes necessary that such region is extended on the field oxide FOX formed in the semiconductor substrate 2 in order to protrude therefrom forming gills indicated with "A" in FIG. 1c. The function of the gills A is that of making the capacitance between the two poly ($C_g$) predominant with respect to the others and of having the channel controlled by the control gate region CG. The size of the gill A further influences the gate capacitive coupling value ($\alpha_g$): a reduction of this parameter has a strong impact on the performance of the cell in terms of programming and erasing time.

The extension of the gill A is thus a critical parameter of the cell geometry. Another critical parameter is also that of the spacing size between two consecutive floating gate regions FG indicated with "H" in FIG. 1c.

A known method flow for realizing these Flash memory cells 1 integrated on a semiconductor substrate 2 is schematically shown in FIGS. 2–5. In these figures vertical section views are shown in a direction parallel to the "Word Lines".

This known method provides the formation in the substrate of a plurality of active areas wherein the memory cells will be realized being separated one another by portions of a field oxide layer FOX. On the substrate 2 a first dielectric layer 3 called "Tunnel Oxide" and a polycrystalline silicon layer 4 called POLY1 are then formed.

This polycrystalline silicon layer 4, whose thickness is of around 50–150 nm, is for example formed by means of LPCVD (Low Pressure Chemical Vapor Deposition). This polycrystalline silicon layer 4 is possibly doped in order to reduce its resistivity, e.g., with an implant of either phosphoric or arsenic or in situ by adding a suitable material, e.g., phosphine, to the deposition environment.

The method goes on with the definition of the layer 4 to realize a plurality of polycrystalline silicon stripes 5 parallel one another. These stripes 5 are separated and insulated from the substrate 2 by means of the oxide layer 3 as shown in FIG. 4.

In particular, in this step a layer 6 of photosensitive material called resist is deposited on the surface of the polycrystalline silicon layer 4 and it is exposed with a suitable radiation in predetermined areas non-protected by a mask. The portions of resist selectively exposed to the radiation have a removing speed higher than that of the non-exposed areas and so they can be removed by means of a chemical solution called developer (FIG. 3). After lithographic definition a dry etching of the polycrystalline silicon stripes 5 is performed to define the floating gate regions FG (FIG. 5).

After depositing an interpoly dielectric layer 7, the standard method flow continues with the definition of the "Word- Lines" by forming a polycrystalline silicon layer 8 (called POLY2).

The "Word Lines" are then defined through a photolithographic method which provides the use of a resist mask so that these word lines are arranged perpendicularly with respect to the polysilicon stripes 5.

Although advantageous under many aspects, this method flow has several drawbacks. In fact, the lithographic transfer of the mask pattern is highly critical and it limits the reduction of the spacing between two consecutive polycrystalline silicon stripes 5.

A difficulty is that of solving structures of lower sizes with respect to the wave length used in the exposition (generally 248 nm or 193 nm). Moreover, the light transmitted through the photoresist layer is reflected from the substrate generating interference phenomena, which cause a degeneration of the pattern transferred from the mask. Normally, in order to reduce the amount of reflected radiation an anti-reflecting material (BARC) is used, which is deposited in the form of layer below the resist layer 6 and which is removed during the etching of the polycrystalline silicon stripes 5.

The interference phenomena causing the degeneration of the pattern transferred from the mask can be reduced also by depositing an oxide layer above the polycrystalline silicon layer 4, which is then removed by means of a dry etching or a final etching solution (so-called "hard mask" method).

Different methods have been developed in the prior art with the aim of improving the pattern definition and thus reducing the spacing between consecutive floating gate regions.

A known method provides the use of a so-called "phase shift" (PSM) mask. This mask id provided with an added layer called phase-shifter, placed on the edges of the drawn structures, which allows to invert the phase of the light crossing it while, at the same time, it destructively interferes with the light crossing the uncovered areas. In this way the splitting of the thin stripes is increased. Even if this method allows to improve the lithographic definition of the floating gate region, it is quite complex and expensive to be implemented. Moreover, this method does not allow to realize openings in the polycrystalline silicon layer smaller than 140 nm +/−10 nm with the lithography 248 nm and smaller than 115 nm +/−10 nm with the lithography 193 nm, and it suffers from the lack of a suitable level of control and intra-die and intra-wafer repeatability.

Another known method is the definition of structures having controlled size, such as for example spacers similar to those used in the definition of the transistors of the LDD type in a sacrificial material (or more suitably in a combination of sacrificial materials) deposited above the polycrystalline silicon layer (POLY1) to be defined to form the floating gate region. By aligning the etching with these spacers smaller sizes than those allowed by the lithography are obtained. After defining the floating gate region, the method flow goes on with the formation of the interpoly dielectric, which allows the sealing of the POLY1, and of a second polycrystalline silicon layer, called POLY2. The cell is then defined by means of standard etching and photolithography techniques.

However, this method has the drawbacks of a lack of repeatability of the desired size of the spacers in all the areas of the die and on the whole wafer, and of a high faultiness inevitably due to the long sequence of depositions and etchings necessary first to define the above cited sacrificial spacers and then to remove them together with all the other layers different from the polycrystalline silicon layer constituting the floating gate region.

Another known method—which recalls the preceding one—for reducing the spacing size between consecutive floating gate regions exploits the polimerization properties of the etching chemical materials. In accordance with this method, an organic material is deposited below a photosensitive resin, which is exposed with a suitable radiation in the presence of a conventional mask in order to define the floating gate regions. Then the organic material is etched by using a very polimerizing chemistry in order to form a sort of spacer of polymer along the walls of the organic material itself and so, aligning with said spacer, the polycrystalline silicon is subsequently etched, in order to repeatably define a poly-poly spacing of smaller sizes with respect to the lithographic ones. However, this method has several drawbacks linked to its essential polimerizing step. In particular, the polimerization is such as to leave working residues that, especially in case much smaller sizes are realized with than those obtainable by means of lithography, then they can cause short-circuits between adjacent floating gate regions during the definition of the polycrystalline silicon.

The technical problem underlying the present invention is that of devising a method for forming non-volatile memory cells, having such characteristics so as to allow the realization of floating gate regions extremely close with each other, thus overcoming the limitations that still affect the manufacturing methods according to prior art.

SUMMARY OF THE INVENTION

The present invention relates to a method for manufacturing non-volatile memory cells on a semiconductor substrate, comprising the following steps:
  forming active areas in said semiconductor substrate, bounded by portions of an insulating layer;
  depositing a first thin layer of tunnel oxide and a first layer of conductive material on said active areas;
  defining a plurality of floating gate (FG) regions.

Definition of the floating gate regions involves first defining the floating gate regions only on pairs of alternated active areas from an active area lacking the floating gate, defining spacers of small width at will in the shelter of the side walls of the floating gate already defined and completing the formation of the floating gate on the active areas that lacked it leaving the definition of the distance between the floating gates to the spacers.

In accordance with one embodiment of the invention, a method is presented for semiconductor fabrication on a substrate including a plurality of active areas. First, a plurality of first polysilicon stripes are formed by photolithographic techniques over even ones of the plurality of active areas. Next, a plurality of second polysilicon stripes are formed without the use of photolithographic techniques over odd ones of the plurality of active areas.

In accordance with another embodiment of the invention, a method is presented for semiconductor fabrication. A plurality of first polysilicon stripes are formed over first alternating active areas. Sidewall spacers for the plurality of first polysilicon stripes are then formed. Next, a plurality of second polysilicon stripes are formed between the sidewall spacers over second alternating active areas. Lastly, the sidewall spacers are removed.

BRIEF DESCRIPTION OF THE DRAWINGS

A more complete understanding of the method and apparatus of the present invention may be acquired by reference to the following Detailed Description when taken in conjunction with the accompanying Drawings wherein.

DETAILED DESCRIPTION OF THE DRAWINGS

Figure 1A:
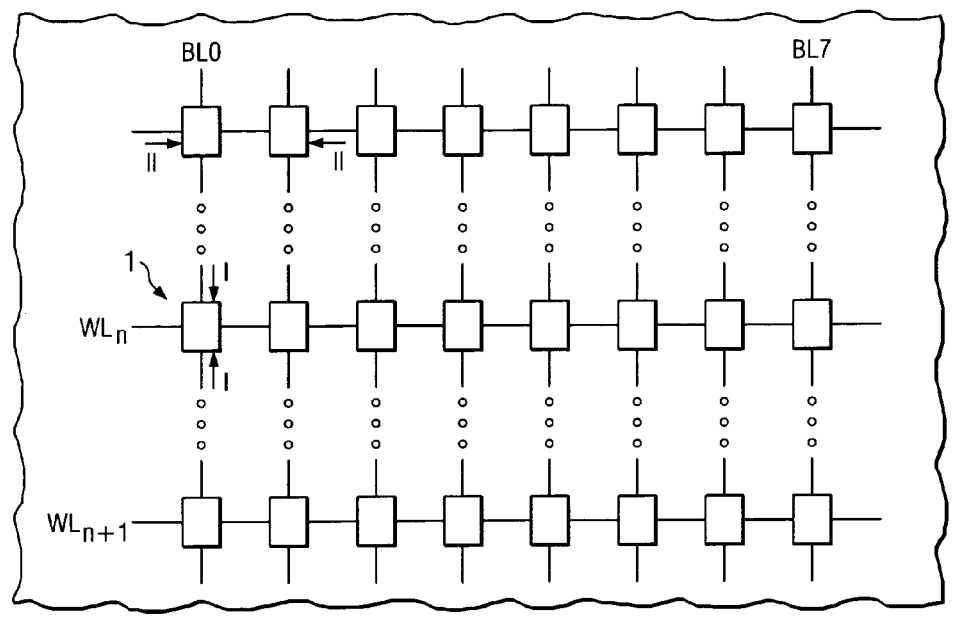
FIG. 1a shows a schematic view of a portion of memory cell matrix in an electronic memory device integrated on semiconductor.
Figure 1B:
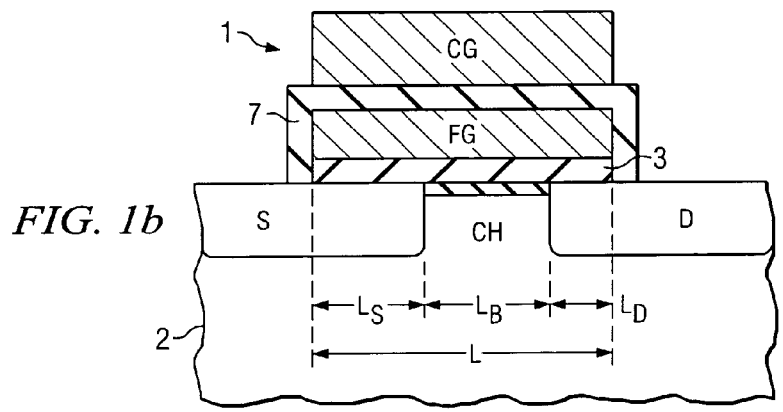
FIG. 1b is a sectional view along the line I—I of FIG. 1a of a conventional memory cell.
Figure 1C:
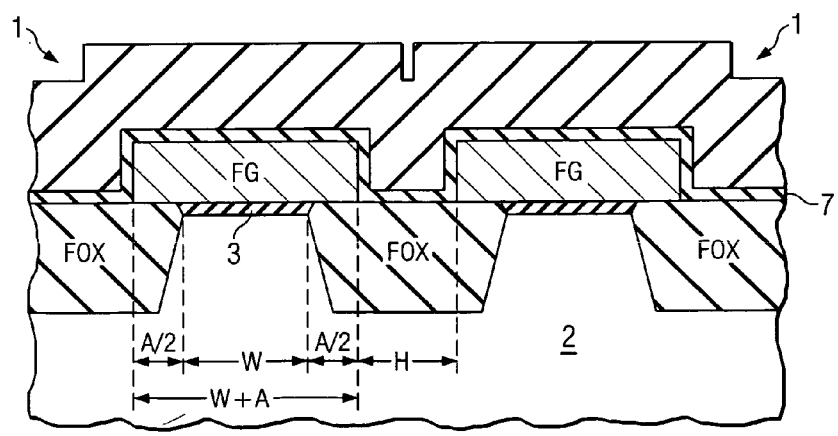
FIG. 1c is a sectional view along the line II—II of FIG. 1a of a conventional memory cell.
Figure 2:
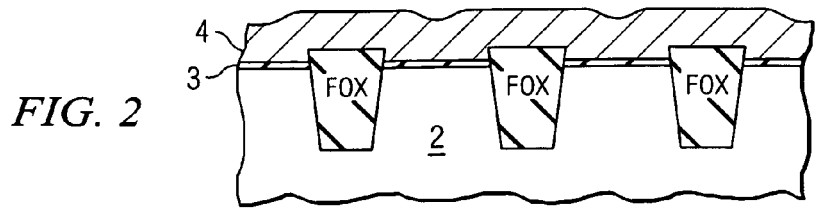
FIGS. 2–5 show respective enlarged vertical sections of a portion of a semiconductor substrate of a method for manufacturing non-volatile memory cells according to prior art.
Figure 3:
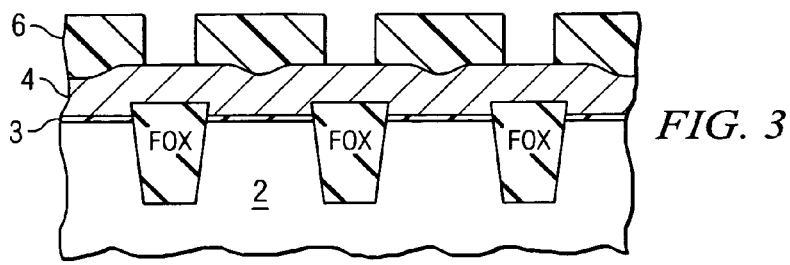
Figure 4:
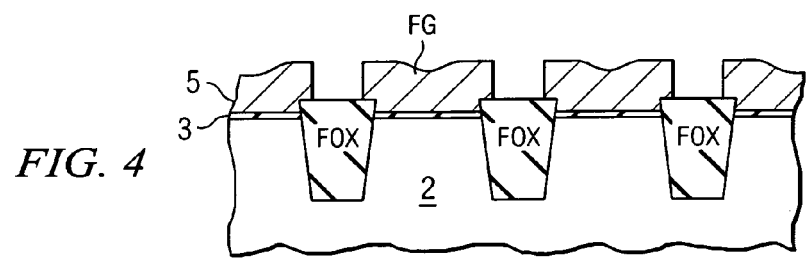
Figure 5:
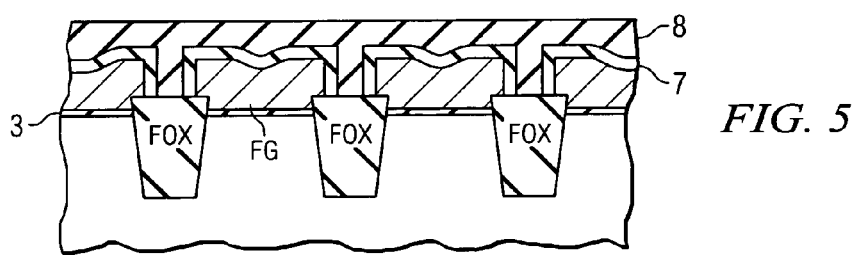

The method steps described hereafter do not form a complete process flow for manufacturing integrated circuits. The present invention can be put into practice together with the techniques for manufacturing integrated circuits currently used in the field, and, in the description, only those commonly used method steps are included being necessary for understanding the present invention.

The figures representing schematic or sectional views of portions of an integrated circuit during manufacturing are not drawn to scale, but only schematically in order to show the essential characteristics of the present invention. In the figures the same reference numbers will be given to structural elements being identical or equivalent from the functional point of view.

With reference to FIGS. 6–10, the method for realizing a memory cell 1 according to the invention will now be described.

On a substrate 2 a plurality of active areas is conventionally realized, wherein the memory cells 1 will be realized being separated from each other by portions of a field oxide layer FOX. On the substrate 2 a first dielectric layer 3 called "Tunnel Oxide" having thickness of 8–12 nm and a first polycrystalline silicon layer 4 called POLY1 constituting the floating gate are then conventionally formed.

This first polycrystalline silicon layer 4, whose thickness is of around 150–200 nm, is for example formed by means of LPCVD (Low Pressure Chemical Vapor Deposition). The first polycrystalline silicon layer 4 is possibly doped in order to reduce its resistivity, e.g., with either a phosphorous or arsenic implant or in situ by adding a suitable material (e.g., phosphine) to the depositing environment.

Figure 7:
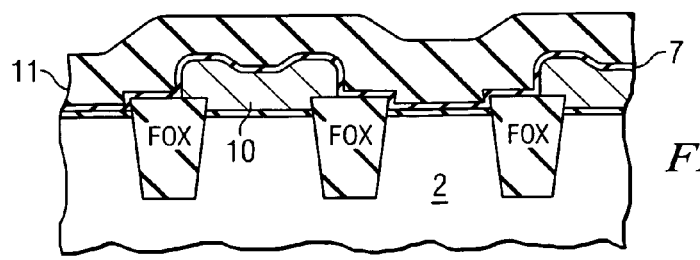

Then the first polycrystalline silicon layer 4 is defined by means of a suitable defining mask in order to leave stripes 10 of the first polycrystalline silicon layer 4 on pairs (for example, even ones) of active areas (each bounded by two portions of field oxide FOX) alternated by an active area (for example, odd ones) whereon no stripe of the first polycrystalline silicon is left (FIG. 7).

Figure 6:
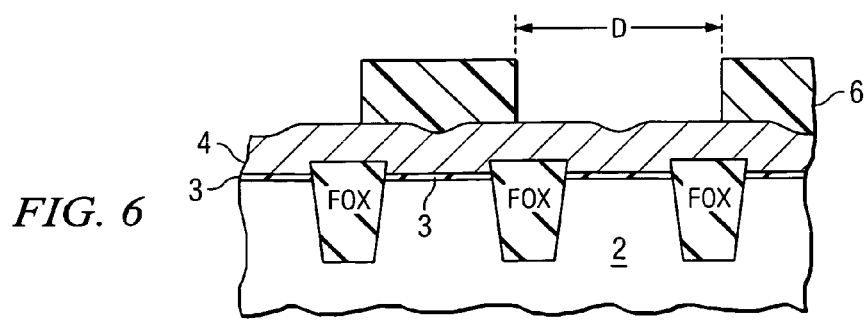
FIGS. 6–10 show respective enlarged vertical sections of a portion of a semiconductor substrate during realization of the method for manufacturing non-volatile memory cells according to the invention.

The definition is realized by depositing resist layer 6 on the first polycrystalline silicon layer 4 and thus by means of conventional lithographic techniques, by impressing and developing the resist layer 6 in order to expose portions of the first polycrystalline silicon layer 4 of a first width D (FIG. 6).

By means of a selective etching, e.g., a plasma etching, are then defined the polycrystalline silicon stripes 10 in the arrangement above indicated separated one another by means of openings having width equal to the first width D.

At this point, a thin oxide film 7 and a silicon nitride layer 11 (FIG. 7) are deposited in sequence, whose thickness determines the final size of the poly-poly spacing.

The deposition of the thin oxide film 7 can occur by means of LCVD techniques and the thickness of such oxide film 7 is of 10–20 nm.

Figure 8:
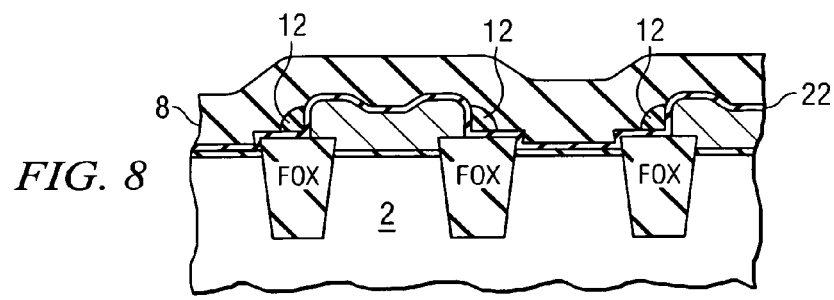

The nitride layer 11 then undergoes an isotropic etching in order to form spacers 12 next to the walls of the polycrystalline silicon stripes 10 (FIG. 8). The oxide layer 7 and the tunnel oxide layer 3 are also removed on the exposed areas (i.e., non covered by the spacers 12) by means of an etching in solution containing hydrofluoric acid (HF).

In this way, the silicon surface left uncovered is prepared in the most suitable way for the growth of a new tunnel oxide layer (indicated with 22 in FIG. 8), since the previously grown tunnel oxide could be damaged by the etching performed to define the polycrystalline silicon stripes 10 and the stripes 12. The equality between two contiguous cells is ensured by the repeatability of the tunnel oxidation, which is the premise for industrial manufacture of non-volatile memories (in the range of 2 Å). During the growth of this second tunnel oxide, also the upper face of the first deposited polysilicon film is oxidized, forming a thermal oxide layer having thickness not lower than that of the tunnel itself (typically between 10 and 30 nm).

Figure 9:
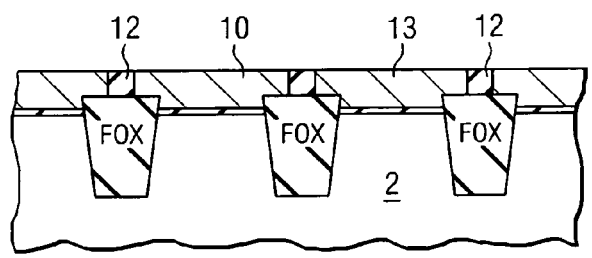

The method according to the invention now goes on, by means of the above described techniques, with the deposition of a second polycrystalline silicon layer 8 having a thickness of 200–400 nm (FIG. 8). Subsequently, the second polycrystalline silicon layer is planarized (FIG. 9) by means of CMP (chemical mechanical polishing) up to a thickness of 100–150 nm, by means of techniques apt to remove also the oxide layer thermally grown up during the formation of the new tunnel oxide layer 22 on the surface of the polycrystalline silicon stripes 10 (FIG. 9).

Figure 10:
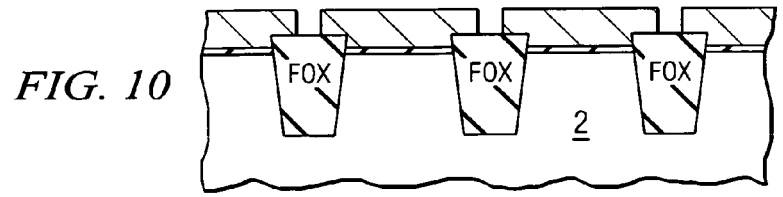

The silicon nitride spacer 12 is then selectively removed, e.g., by means of an etching in phosphoric acid solution and the oxide on the walls of the polycrystalline silicon stripes 10 is removed by means of an etching typically in HF solution, in case it is not to be used as part of the interpoly dielectric (FIG. 10).

In the method according to the invention, after defining the floating gate region FG, the process flow goes on with the formation of the interpoly dielectric, which allows sealing of the POLY1, and of the second polysilicon layer, called POLY2. The cell is then defined by means of etching and photolitographic standard techniques.

The main advantage of the present invention is the possibility of sizing the poly-poly spacing, even below minimum sizes obtainable by means of lithography, by only regulating the thickness of the silicon nitride deposited on the poly, and of overcoming the lithographic limits of the prior art technique linked to the definition of the very small poly-poly spacings.

In fact, in the method according to the invention, the definition of the floating gate regions FG involves sizes both of the resist stripes and of the spacing between adjacent stripes much superior with respect to the limits imposed by existing techniques.

This allows an excellent size control both intra-wafer and intra-die.

Although preferred embodiments of the method and apparatus of the present invention have been illustrated in the accompanying Drawings and described in the foregoing Detailed Description, it will be understood that the invention is not limited to the embodiments disclosed, but is capable of numerous rearrangements, modifications and substitutions without departing from the spirit of the invention as set forth and defined by the following claims.

What is claimed is:

1. A method for manufacturing non-volatile memory cells on a semiconductor substrate, comprising at least the following steps:
    forming active areas in said semiconductor substrate, bounded by portions of an insulating layer;
    forming a first thin layer of tunnel oxide and depositing a first layer of conductive material on said active areas;
    defining a plurality of floating gate regions, wherein the definition of the floating gate regions comprises the steps of:
    defining said first layer of conductive material in order to form a plurality of alternated stripes which form first floating gates above pairs of active areas alternated by active areas lacking stripes;
    forming spacers in the shelter of the side walls of said alternated stripes,
    depositing a second layer of conductive material in order to fill the space between said spacers so as to form second floating gates above the active areas which previously lacked stripes, and
    polishing said second layer of conductive material together with said first layer of conductive material and said spacers to the same planar level.

2. The method according to claim 1, wherein said plurality of alternated stripes is formed by depositing said first layer of conductive material and by defining said first layer of conductive material by means of lithography.

3. The method according to claim 2, wherein a thin oxide layer is deposited after forming said plurality of alternated stripes.

4. The method according to claim 3, wherein the formation of said spacers in the shelter of the side walls of the alternated stripes comprises the deposition of a nitride layer which is patterned together with said thin oxide layer and said tunnel oxide layer in order to expose the active areas whereon no alternated stripes are located.

5. The method according to claim 4, further comprising reconstruction of the tunnel oxide on the exposed active areas by means of formation of a second tunnel oxide layer being thermally grown.

6. A method for manufacturing non-volatile memory cells on a semiconductor substrate, comprising:
    forming active areas in said semiconductor substrate, bounded by portions of an insulating layer;
    depositing a first thin layer of tunnel oxide and a first layer of conductive material on said active areas; and
    defining a plurality of floating gate regions, comprising:
    defining a first floating gate from the first layer of conductive material only over pairs of alternated active areas;
    defining spacers in the shelter of the side walls of the first floating gate already defined; and
    completing the formation of the floating gate regions over the active areas that lacked by depositing a second layer of conductive material defining a second floating gate between the spacers.

7. A semiconductor fabrication method, comprising:
    forming a plurality of first polysilicon stripes to define first semiconductor gate structures over first alternating transistor active areas bounded by insulating portions;
    forming sidewall spacers for the plurality of first polysilicon stripes; and
    forming a plurality of second polysilicon stripes between the sidewall spacers to define second semiconductor gate structures over second alternating transistor active areas.

8. The method according to claim 7, wherein forming the plurality of first polysilicon stripes comprises:
    depositing a first polysilicon layer;
    defining the first polysilicon stripes in the first polysilicon layer using a photolithography mask;
    etching using the mask to remove the first polysilicon layer but leave the first polysilicon stripes.

9. The method according to claim 7, wherein forming the plurality of second polysilicon stripes comprises:
    depositing a second polysilicon layer that covers the first polysilicon stripes and fills a region between sidewall spacers;
    polishing to remove the second polysilicon layer but leave the second polysilicon stripes and spacers wherein the first and second polysilicon stripes and the spacers are at the same planar level.

10. A semiconductor fabrication method, comprising:
    forming a plurality of first polysilicon stripes to define first semiconductor gate structures over first alternating transistor active areas;
    forming sidewall spacers for the plurality of first polysilicon stripes; and
    forming a plurality of second polysilicon stripes between the sidewall spacers to define second semiconductor gate structures over second alternating transistor active areas;
    wherein forming sidewall spacers comprises:
    depositing a nitride layer; and
    patterning the nitride layer to expose the second alternating active areas but leave the nitride layer adjacent sidewalls of the first polysilicon stripes.

11. A method for manufacturing non-volatile memory cells on a semiconductor substrate, comprising the steps of:
    forming active areas in said semiconductor substrate, bounded by portions of an insulating layer;
    forming a first thin layer of tunnel oxide and depositing a first layer of conductive material on said active areas;
    defining a plurality of floating gate regions, wherein the definition of the floating gate regions comprises the steps of:
    defining said first layer of conductive material in order to form a plurality of alternated stripes above pairs of active areas alternated by active areas lacking stripes;
    depositing a thin oxide layer;
    forming spacers in the shelter of the side walls of said alternated stripes, comprising the deposition of a nitride layer which is patterned together with said thin oxide layer and said tunnel oxide layer in order to expose the active areas whereon no alternated stripes are located, depositing a second layer of conductive material in order to fill the space between said spacers, and planarizing said second layer of conductive material together with said first layer of conductive material and said spacers.

12. The method according to claim 11, wherein said plurality of alternated stripes is formed by depositing said first layer of conductive material and by defining said first layer of conductive material by means of lithography.

13. The method according to claim 11 further including selectively removing said spacers.

* * * * *